(12) United States Patent
Guo et al.

(10) Patent No.: US 9,407,843 B2
(45) Date of Patent: Aug. 2, 2016

(54) DETECTOR SYSTEM AND MODULE FOR COMPENSATING DARK CURRENT

(71) Applicant: General Electric Company, Schenectady, NY (US)

(72) Inventors: Jianjun Guo, Ballston Spa, NY (US); Chang Lyong Kim, Waukesha, WI (US); David Leo McDaniel, Dousman, WI (US); James Lindgren Malaney, Brookfield, WI (US); Sergei Ivanovich Dolinsky, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 194 days.

(21) Appl. No.: 14/061,557

(22) Filed: Oct. 23, 2013

(65) Prior Publication Data
US 2015/0108328 A1    Apr. 23, 2015

(51) Int. Cl.
| | |
|---|---|
| H04N 5/361 | (2011.01) |
| G01T 1/24 | (2006.01) |
| G01J 1/18 | (2006.01) |
| H04N 5/217 | (2011.01) |
| H01L 31/0216 | (2014.01) |
| G01J 1/44 | (2006.01) |

(52) U.S. Cl.
CPC . *H04N 5/361* (2013.01); *G01J 1/18* (2013.01); *G01T 1/249* (2013.01); *G01J 2001/186* (2013.01); *G01J 2001/444* (2013.01); *H01L 31/02164* (2013.01); *H04N 5/2176* (2013.01)

(58) Field of Classification Search
CPC . G01J 1/18; G01J 2001/186; G01J 2001/444; H04N 5/361; H04N 5/2176; H01L 31/02164
See application file for complete search history.

(56) References Cited

U.S. PATENT DOCUMENTS

| | | |
|---|---|---|
| 4,227,155 A | 10/1980 | Lerma |
| 4,630,121 A | 12/1986 | Suzuki et al. |
| 5,500,521 A | 3/1996 | Suzuki |
| 5,519,437 A | 5/1996 | Nelvig |

(Continued)

FOREIGN PATENT DOCUMENTS

| | | |
|---|---|---|
| JP | 56161781 A | 12/1981 |
| WO | 8910037 A1 | 10/1989 |
| WO | 2011140385 A2 | 11/2011 |

OTHER PUBLICATIONS

Faxed Documents from Applicant: Documents were original faxed amendment by Applicant on Dec. 28, 2015.*

(Continued)

*Primary Examiner* — Francis M Legasse, Jr.
(74) *Attorney, Agent, or Firm* — Melissa K. Dobson

(57) ABSTRACT

A compensating current is applied at one or more points in a signal processing path to compensate for one or both of a dark or offset current present in an input signal. In certain implementations, the dark or offset current is present in a signal generated by a photomultiplier device. The dark or offset current may be monitored in an output of the signal processing path and, the monitoring being used to determine how much compensation is needed in the signal processing path and to allocate where in the signal processing path the compensation current will be applied.

16 Claims, 5 Drawing Sheets

(56) References Cited

U.S. PATENT DOCUMENTS

| | | | |
|---|---|---|---|
| 6,525,769 B1 | 2/2003 | Thomas et al. | |
| 7,639,291 B2 | 12/2009 | Lim et al. | |
| 8,154,631 B2 | 4/2012 | Herrmann et al. | |
| 8,310,577 B1 | 11/2012 | Neter | |
| 2005/0200732 A1* | 9/2005 | Tan | G01J 1/0252 348/243 |
| 2011/0248175 A1* | 10/2011 | Frach | G01T 1/2018 250/363.03 |

OTHER PUBLICATIONS

Dolinsky et al., "Multiplexing requirements for solid state photomultipliers in time-of-flight PET", IEEE Nuclear Science Symposium Conference Record (NSS/MIC), pp. 1763-1766, Oct. 30-Nov. 6, 2010, Location: Knoxville, TN.

Roncali et al., "Application of Silicon Photomultipliers to Positron Emission Tomography", Ann Biomed Eng., vol. 39, Issue 4, pp. 1358-1377, Apr. 2011.

\* cited by examiner

DETECTOR SYSTEM AND MODULE FOR COMPENSATING DARK CURRENT

BACKGROUND

The subject matter disclosed herein relates to detection systems for use in imaging systems, such as nuclear medicine imaging systems.

Diagnostic imaging technologies allow images of the internal structures of a patient to be obtained and may provide information about the function and integrity of the patient's internal structures. Diagnostic imaging systems may operate based on various physical principles, including the radiation emission from or transmission through the patient tissues. For example, single photon emission computed tomography (SPECT) and positron emission tomography (PET) may utilize a radiopharmaceutical that is administered to a patient and whose decay results in the emission of gamma rays from locations within the patient's body. The radiopharmaceutical is typically selected so as to be preferentially or differentially distributed in the body based on the physiological or biochemical processes in the body. For example, a radiopharmaceutical may be selected that is preferentially processed or taken up by tumor tissue. In such an example, the radiopharmaceutical will typically be disposed in greater concentrations around tumor tissue within the patient.

In the context of PET imaging, the radiopharmaceutical produces a positron particle during its decay process. The positron combines with an electron in the patient to produce two annihilation photons (511 KeV gammas) which travel in opposite directions. In SPECT imaging, a single gamma ray is generated when the radiopharmaceutical breaks down or decays within the patient. These gamma rays interact with detection mechanisms within the respective PET or SPECT scanner, which allow the decay events to be localized, thereby providing a view of where the radiopharmaceutical is distributed throughout the patient. In this manner, a caregiver can visualize where in the patient the radiopharmaceutical is disproportionately distributed and may thereby identify where physiological structures and/or biochemical processes of diagnostic significance are located within the patient.

One issue that may arise is that, in certain detector technologies, noise or dark counts may also be generated, such as due to the electronic noise or background effects. Such dark counts may be indistinguishable from the desired signal and may reduce the linear dynamic range of the readout electronics.

BRIEF DESCRIPTION

In one embodiment, a detector module is provided. The detector module comprises an application specific integrated circuit (ASIC) that in turn comprises one or more channel inputs configured to receive respective analog inputs from one or more photo-sensors and one or more front-end electronics amplifiers configured to process the analog inputs to generate an output signal. The detector module further comprises a controller configured to measure a dark current including leakage current present in the output signal, to determine a compensation current sufficient to counter the dark current and/or leakage current from the photo sensor, and the leakage current and/or offset current from the front-end electronics, and to apply the compensation current through one or more of the signal processing electronic elements In a further embodiment, a method for compensating a dark current is provided. The method comprises the act of measuring a dark current component and/or an offset current component of an output energy signal. A compensation current is adjusted to compensate for the one or both of the dark or offset current. The compensation current is applied at one or more points in a signal processing path used to generate the output energy signal.

In an additional embodiment, a detector system is provided. The detector system comprises a plurality of silicon photomultipliers (SiPMs) or other photo sensors configured to each generate a respective measured signal. Each measured signal comprises a dark current component and a signal component. The detector system further comprises an application specific integrated circuit (ASIC) configured to receive the measured signals as inputs, to process the measured signals along a signal processing path to generate at least an output energy signal, and to apply a compensation current at one or more points in the signal processing path to compensate the dark current component in the output energy signal.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Embodiments disclosed herein relate to the readout of a detector in a nuclear imaging system, such as a positron emission tomography (PET) or single photon emission computed tomography (SPECT) imaging system or in a combined or hybrid imaging system including such PET or SPECT imaging functionality (e.g., a PET/MR, a PET/CT, or a SPECT/CT imaging system). In particular, as discussed herein, in various implementations a compensating or correction current is applied at various points in a signal processing path to compensate for dark current present in an input signal. In certain such implementations, the dark current and the offset originate from the internal readout electronics and may be monitored and used to determine how much compensation is needed and to allocate where in the signal chain the different amounts of compensation current may be applied. In this manner, dark current present in an input signal maybe compensated and linear signal dynamic range of the readout circuitry preserved.

Figure 1:
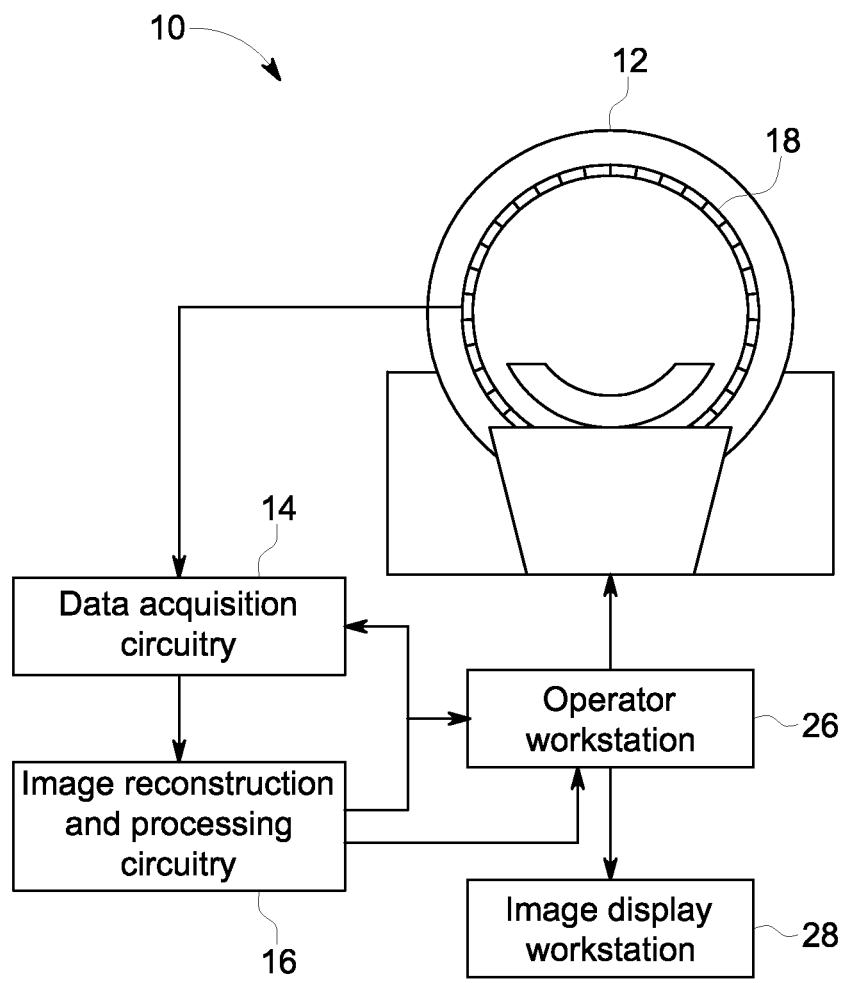
FIG. 1 is a diagrammatical representation of a PET imaging system in accordance with aspects of the present disclosure.

With the foregoing in mind and turning now to the drawings, FIG. 1 depicts a PET system 10 operating in accordance with certain aspects of the present disclosure. Such a PET system 10 may be used in isolation or in conjunction with another imaging modality, such as a CT or MRI imaging system. Though a PET system 10 is described and discussed herein, it should be appreciated that the present approach may also be useful in other imaging contexts, such as in a SPECT imaging system.

Returning now to FIG. 1, the depicted PET system 10 includes a detector assembly 12, data acquisition circuitry 14, and image reconstruction and processing circuitry 16. The detector assembly 12 of the PET system 10 typically includes a number of detector modules (generally designated by reference numeral 18) arranged about the imaging volume, as depicted in FIG. 1. As discussed herein the detector assembly 12, via the modules 18, may be configured to generate signals in response to gamma rays generated by positron annihilation events and emitted from a subject within the imaged volume. In certain implementations, the detector assembly 12 can include scintillators and photon detection electronics. The detector assembly 12 may be of any suitable construction and configuration for acquiring PET data. For example, as in the depicted example, the detector assembly 12 can be configured as a full or partial ring.

In certain implementations, gamma rays may be converted, such as in a scintillator of the detector assembly 12 or detector modules 18, to lower energy photons that in turn may be detected and converted in the detector modules 18 to electrical signals, which can be conditioned and processed to output signals. These output signals can be used to match pairs of gamma ray detections as potential coincidence events. That is, in such a PET implementation, when two gamma rays strike opposing detectors it may be determined that a positron annihilation occurred somewhere on the line connecting the two impact locations (absent the effects of interactions of randoms and scatter detections). In SPECT implementations, line of flight information may instead be inferred based at least in part on the collimation associated with the detector assembly. The collected data can be sorted and integrated and used in subsequent processing such as by image reconstruction and processing circuitry 16.

Thus, in operation, the data acquisition circuitry 14 is used to read out the signals from the detector modules 18 of the detector assembly 12, where the signals are generated in response to gamma rays emitted within the imaged volume. The signals acquired by the data acquisition circuitry 14 are provided to the image reconstruction and processing circuitry 16. The image reconstruction and processing circuitry 16 generates an image based on the derived gamma ray emission locations. The operator workstation 26 is utilized by a system operator to provide control instructions to some or all of the described components and for configuring the various operating parameters that aid in data acquisition and image generation. The operating workstation 26 may also display the generated image. Alternatively, the generated image may be displayed at a remote viewing workstation, such as the image display workstation 28.

It should be appreciated that, to facilitate explanation and discussion of the operation of the PET system 10, the data acquisition circuitry 14 and the image reconstruction and processing circuitry 16 have been shown separately in FIG. 1 from other illustrated components (e.g., the detector assembly 12, the operator workstation 26, and the image display workstation 28). However, it should be appreciated that, in certain implementations, some or all of these circuitries may be provided as part of the detector assembly 12, the operator workstation 26, and/or the image display workstation 28. For example, the hardware, software, and/or firmware executed on or provided as part of the data acquisition circuitry 14, whether provided as part of the detector assembly 12, the operator workstation 26, and/or the image display workstation 28, may be used to perform various detector readout and/or control actions described herein. In certain implementations the data acquisition circuitry 14 may include specially configured or programmed hardware, memory, or processors (e.g., application-specific integrated circuits (ASICs)) for performing detector readout steps as discussed herein. Similarly, certain of these readout functions may be performed using one or more general or special purpose processors and stored code or algorithms configured to execute on such processors. Likewise, a combination of special purpose hardware and/or circuitry may be used in conjunction with one or more processors configured to execute stored code to implement the steps discussed herein.

With this in mind, the detector technology in one implementation of a system such as that depicted in FIG. 1 will be discussed in greater detail. In particular, a PET or SPECT system may utilize arrays of photo sensors as part of the gamma ray detection mechanism. Such devices may take the form, in certain implementations, of silicon photomultiplier (SiPM) devices, such as an array of passively quenched Geiger-mode avalanche photodiodes (APD) for detecting impinging photons. In general, SiPM devices used for photon detection can provide information about certain parameters, such as the time of the impingement event, the energy associated with the event, and the position of the event within the detector. These parameters can be determined through processing algorithms applied to the analog signals generated by the SiPM.

However, as noted above, such SiPM device may also generate "dark current", that is not in response to an impinging photon. Instead, it is in the form of current which flows when a reverse voltage is applied to a photodiode even in a dark state. This dark current may arise from several origins including but not limited to, thermally generated electron-hole pairs in the Si which are multiplied by the SiPM (giving rise to dark counts), and non-amplified currents generated in the SiPM. For example, the dark current generated by the SiPM devices in conjunction with the signal generated in response to photon impacts present themselves as a large, inconsistent current to the readout electronics, which receive both the dark current and the legitimate signal simultaneously from the SiPM devices. This dark current, therefore, reduces the linear dynamic range of the readout electronics and prevents the SiPM devices from being operated at the desired bias voltage.

As discussed herein, to compensate for dark current a series of programmable current sources/sinks of the proper polarity are implemented along the signal processing chain, such as at the input node or branch of the front-end buffer, at the output node of the front-end buffer, and/or at the input and output nodes of the weighting and summing amplifiers. In one embodiment, a multichannel readout front-end application-specific integrated circuit (ASIC) interfaces with an array of SiPMs in a PET (or SPECT) system. The ASIC may be provided as part of the data acquisition circuitry 14 of FIG. 1 and may be configured to provide information on the timing, energy, and location of events to a processing system (e.g., processing circuitry 16), as well as the ability to bias each SiPM. With this in mind, in one embodiment, control logic monitors the baseline in energy output from the detector modules, determines the proper amount of compensation current, and allocates the proper portions of the compensation current to different nodes along the signal chain. If necessary, this procedure may be reiterated until the output offset is at the desired level. For example, in one implementation the control logic configures the programmable compensation current source/sinks, as discussed herein. In this manner, the impact of the dark current on the linear signal dynamic range and the internal offsets of the readout circuitry is minimized or reduced by employing programmable shunting sources/sinks of the opposite polarity to compensate for the dark current.

Figure 2:
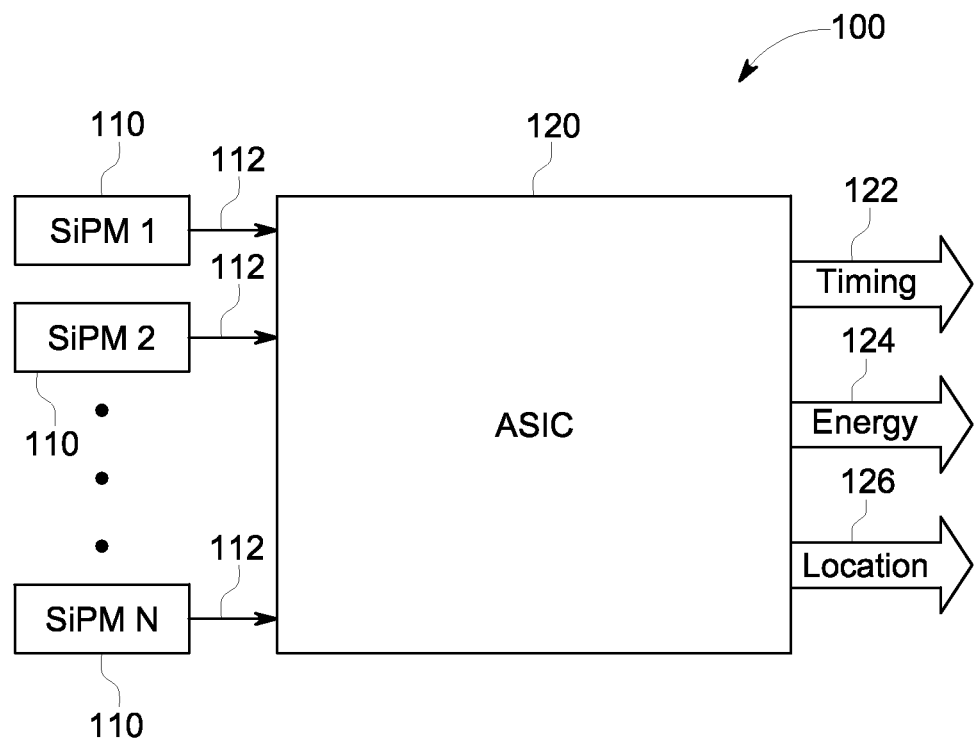
FIG. 2 is a block diagram of one example of a PET detector module with an ASIC in accordance with aspects of the present disclosure.
Figure 3:
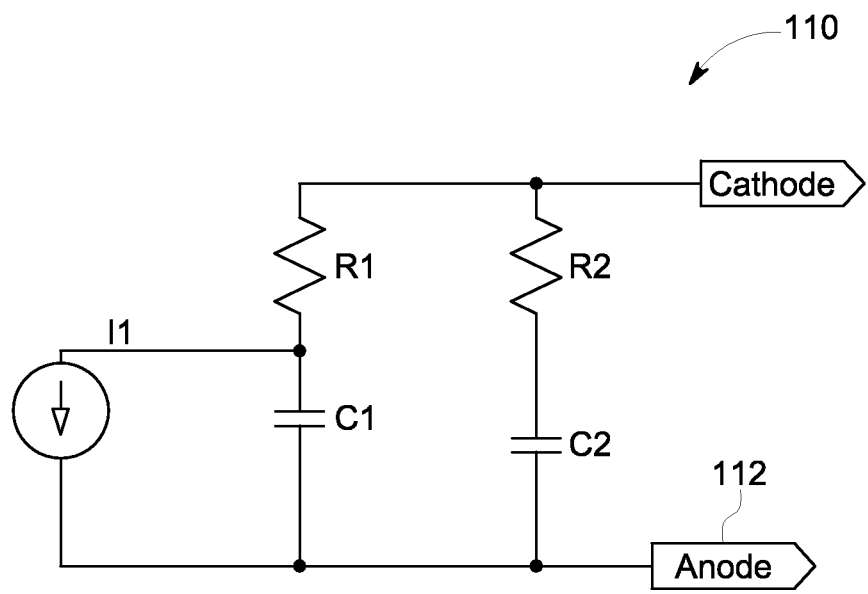
FIG. 3 depicts a simplified electrical model of one example of a SiPM device, in accordance with aspects of the present disclosure.

Turning to FIG. 2, a block diagram is depicted representing one example of a PET detector module with ASIC 100, such as may be used with the PET system 10 of FIG. 1. The PET detector module 100 may include a plurality of SiPMs 110 as well as an ASIC 120 as part of the detector modules 18 and/or data acquisition circuitry 14. Light generated in a scintillator in response to a gamma ray interaction is detected by at least one SiPM and amplified. In this example, each SiPM 110 includes an analog anode output 112 in electrical communication with the ASIC 120. That is, the outputs of the SiPMs 110 are the inputs to the respective ASIC 120. The ASIC 120, in turn provides one or more timing signals 122, energy signals 124, and/or position signals 126 as outputs. Each of these signals output by the ASIC 120 corresponds to information obtained from the respective SiPMs 110 after processing by the ASIC 120. By way of a non-limiting example, in one embodiment, a data acquisition system 100 can include eighteen (18) SiPMs 110. However, in other implementations, other quantities of SiPMs 110 may be present within a data acquisition system 100. Turning to FIG. 3, an example of a simplified electrical model of the SiPM 110 of FIG. 2 is depicted. In this example, the SiPM 110 has an analog anode output 112, which as noted with respect to FIG. 2, can provide an input for the ASIC 120.

Figure 4:
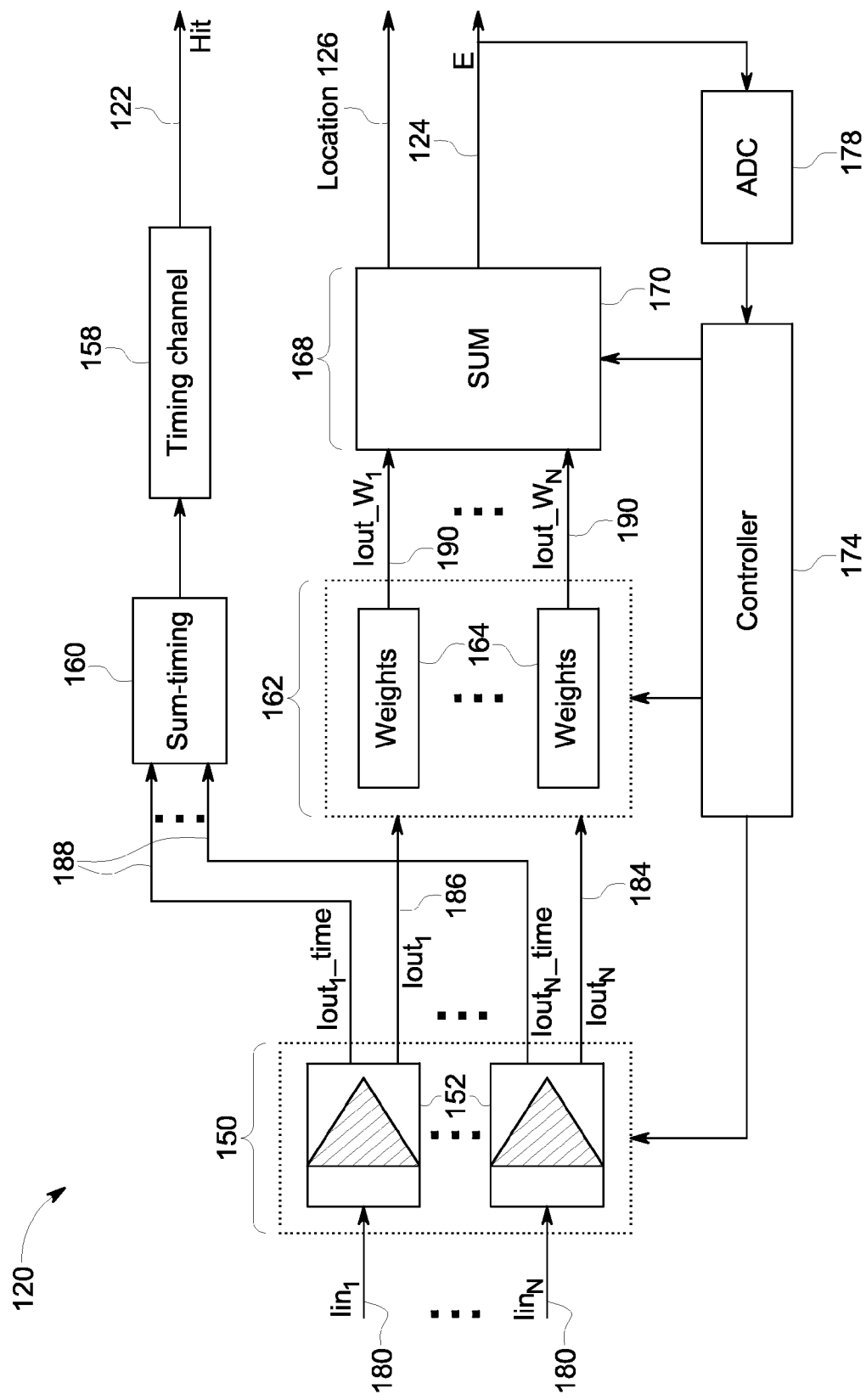
FIG. 4 is a block diagram of one example of an ASIC, in accordance with aspects of the present disclosure.

Turning to FIG. 4, this figure depicts a block diagram of one example of the ASIC 120 of FIG. 2. In the depicted example, the ASIC 120 includes a front end circuit 150 (e.g., front end amplifiers 152), a time discriminating circuit (e.g., a timing channel 158 including a summing circuit 160), a weighting circuit 162 (e.g., weighting amplifiers 164), an energy summing circuit 168 (e.g., a summing amplifier 170), and a bias generation circuit (e.g., a controller 174). In addition, the ASIC 120 is depicted as including an analog-to-digital converter (ADC) 178. However, the ADC 178 and all or part of the controller 174 can be implemented on or off the ASIC 120, depending on the implementation. For example, in an alternative implementation, the controller 174 can be implemented off the ASIC 120, such as by calculating updates to the compensation currents in a field-programmable gate array (FPGA). The analog anode outputs 112 of the SiPM devices 110 can be DC coupled to the ASIC front end circuit 150 as inputs, such as shown in FIG. 4 and described below. In one embodiment, the analog anode output 112 of each SiPM device 110 can be individually biased via the front end circuit 150 (e.g., by the respective front end amplifiers 152) of the ASIC 120 to a desired potential. In one example, where there are N SiPMs (e.g., eighteen SiPMs) connected as inputs to the front end circuit 150, a corresponding digital-to-analog converter (DAC) circuit within (or in communication with) the controller 174 used to apply the bias may be an N-channel (e.g., 18-channel) DAC. By way of example, in one embodiment, the DAC can provide a bias voltage through a resistor to the analog anode outputs 112 of the SiPMs 110, and all the diodes can share a common cathode. In such an embodiment, the anode output 112 couples into the front end of the ASICS 120 through a capacitor.

The front end circuit 150 can function as a current buffer and, as depicted, can include one or more amplifiers 152 that have very low input impedance and high bandwidth, which provide high timing resolution and preserve the energy information of the input signals 180. The front end circuit 150 can amplify and duplicates each of the current signals 180 received from each of the analog anode outputs 112 (depicted as current input ($\text{Iin}_x$) through channels 1 through N (i.e., $\text{Iin}_1$ through $\text{Iin}_N$)) into two copies using a current mirror. In particular, each current input signal 180 can be duplicated into a respective first line out ($\text{Iout}_x$) signal 186 (i.e., $\text{Iout}_1$ through $\text{Iout}_N$) that is an input to the energy and position determining circuitry and a respective second line out (i.e., timing signals $\text{Iout}_{x\_\text{time}}$) signal 188 (i.e., $\text{Iout}_{1\_\text{time}}$ through $\text{Iout}_{N\_\text{time}}$) that is provided to the timing channel 158.

The timing signals 188 (i.e., $\text{Iout}_{x\_\text{time}}$) output from the front end circuit 150 can be summed before or after leaving the front end circuit 150 (such as at the summing circuit 160). The summed timing signals represent a summation of signals from one or more of the SiPM analog anode outputs 112. This summed signal can be used by the time discriminating circuit (i.e., timing channel 158) for generating timing information as outputs 122. By way of example, in one embodiment, the time discriminating circuit can process the combined or summed signal to generate a HIT signal as output 122.

The other output signals 186 (i.e., $\text{Iout}_x$) from the front end circuit 150 may be processed to generate energy and position information as outputs 124, 126. By way of example, the position information may include two-dimensional position coordinates along respective axes (such as x and z axes). Similarly, the energy information may convey a measure of the energy associated with an observed detection event.

In the depicted example, the energy and position determining path applies programmable weightings (via weighting circuit 162 and weighting amplifiers 164) to the respective output signals 186 (i.e., $\text{Iout}_x$) from the front end circuit 150. The resulting weighted signals 190 (i.e., $\text{Iout}\_W_1$ through $\text{Iout}\_W_N$) can each have three components: an energy component, a first position (e.g., row) component, and a second position (e.g., column) component. Each of the weighted energy components can be summed, such as at the energy summing circuit 168, and output as a summed energy output 124. Though not shown, each of the position components can be respectively summed as well and output as summed row and column outputs. In the depicted example, the controller 174 interfaces with the weighting circuit 162 and energy summing circuit 168 (in addition to front end circuit 150) to configure operation of the weighting and summing operations.

With the foregoing description of the ASIC 120 in mind, the present disclosure relates an algorithmic approach for compensating for dark current in the SiPM signal path using the ASIC 120. In particular, as the SiPM input signals 180 typically will include both a signal component, representing the events which are to be detected, and a dark current component. In practice, the signal current component of each input signal $\text{Iin}_x$ may be in the range of approximately 1~10 mA while the dark current component may be in the range of approximately 1~50 μA on average. However, the dark current contribution may vary over time and in response to temperature fluctuations and, further, may vary from pixel to pixel. The fluctuating dark current, therefore, effectively acts like a changing baseline that reduces the linear dynamic range of the detection system.

Figure 5:
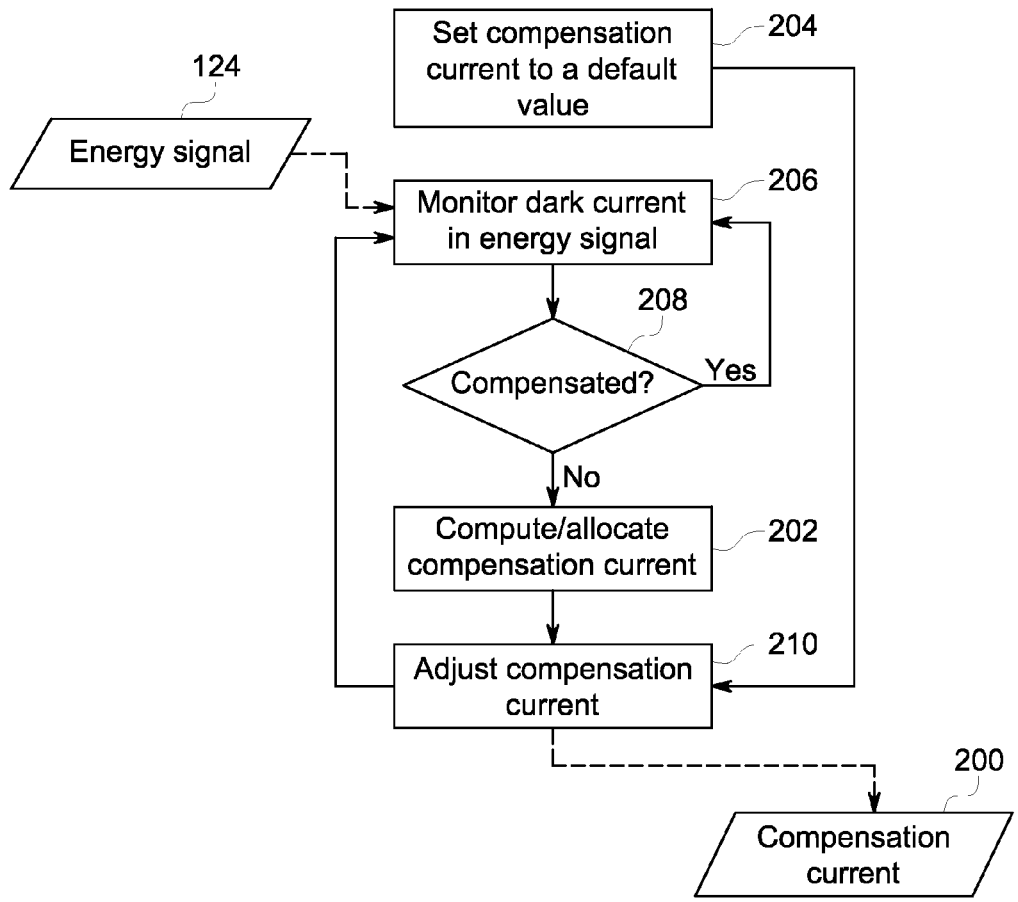
FIG. 5 is a flowchart depicted control logic steps for compensating a dark current component of a signal, in accordance with aspects of the present disclosure.

Turning to FIG. 5, in one embodiment utilizing the ASIC 120 of FIG. 4, dark current compensation is achieved by applying (block 210) a compensation current 200 via the controller 174 at various points in the signal path that counteracts or compensates for the dark current that is present. In one implementation, the compensation current is initially set to a default value, for example 0 or a value between 0 and 500 μA (block 204). The offset current (dark current level and compensation current) is monitored (block 206) in the energy signal 124 output by the energy measurement signal path. Based on the measured offset current in the energy output 124, the controller 174 computes the compensation current required (block 202) and sets or adjusts (block 210) the compensation current 200 applied at different points of the signal processing path (e.g., at the front end amplifiers 152, weighting amplifiers 164, summing amplifier for timing 160 and energy summing amplifier 170). The measurement of the dark current within the energy signal 124 and the updating and allocation of the compensating current 200 may be repeated (via recurrence of decision block 208) until the dark current is determined to be compensated to the desired level.

Figure 6:
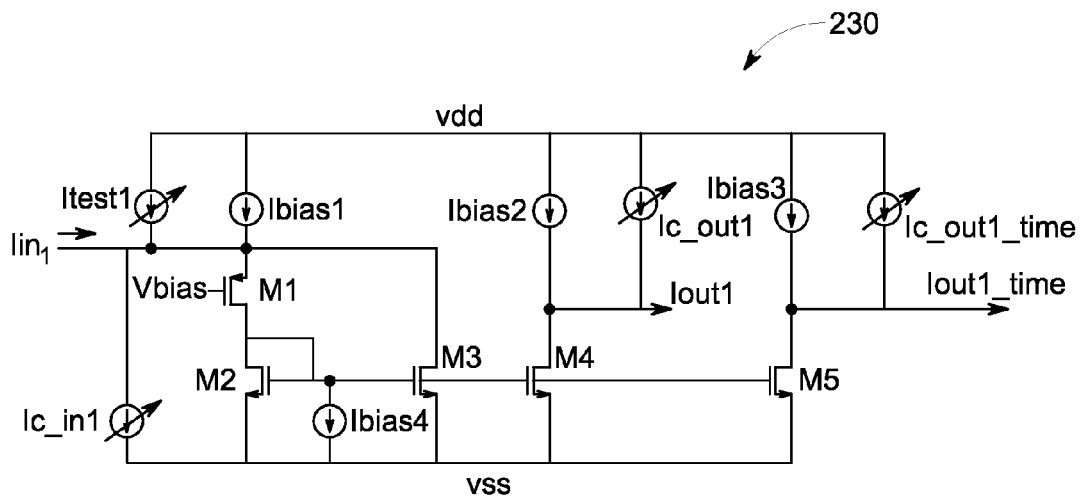
FIG. 6 is a circuit view of a front amplifier circuit, in accordance with aspects of the present disclosure.

With this in mind, and turning to FIG. 6, an example of a circuit 230 is depicted that, in one implementation, may be used to compensate dark current in front end amplifiers 152. In this example, the controller 174 generates control signals that configure (i.e., program) programmable current source(s)/sink(s) in the form of a test current (i.e., $Itest_1$), a correction current input (i.e., $Ic\_in_1$), a correction current output for the energy determination path (i.e., $Ic\_out_1$), and a correction current output for the timing determination path (i.e., $Ic\_out_1\_time$). The depicted circuit also includes a number of field-effect transistors (FETs) (in the depicted example, metal-oxide semiconductor field effect transistors (MOSFETs) M1-M5) that are employed in the operation of the circuit 230. In the depicted circuit 230, $Itest_1$ is a programmable current source that is used to test the functionality of the signal chain. Similarly, $Ic\_in_1$ is a programmable current sink that generates an opposing current that compensates the dark current from SiPM anode 112 that is present in the input $Iin_1$ provided to the front-end amplifier 152. With respect to the remaining programmable current sources, $Ic\_out_1$ is programmed by the controller 174 to compensate the dark current from SiPM anode 112 that is present in the energy output 186 ($Iout_1$) of the front-end amplifier 152. Similarly, $Ic\_out_1\_time$ is programmed by the controller 174 to compensate the dark current from SiPM anode 112 that is present in the timing output 188 ($Iout_1\_time$) of the front-end amplifier 152.

Figure 7:
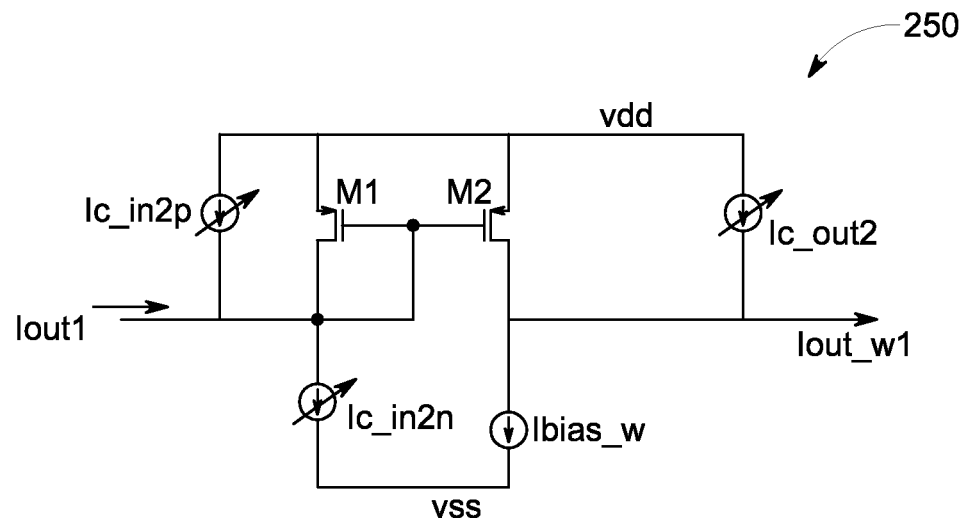
FIG. 7 is a circuit view of a weighting amplifier circuit, in accordance with aspects of the present disclosure.

Turning to FIG. 7, an example of a circuit 250 is depicted that, in one implementation, may be used to compensate dark current in weighting amplifiers 164. As in the preceding example, the controller 174 generates control signals that configure (i.e., program) programmable current source(s)/sink(s) within the circuit 250. In the depicted example, the programmable sources and sinks include: $Ic\_in_2p$, $Ic\_in_2n$, and $Ic\_out_2$. The depicted circuit also includes a pair of FET devices (in the depicted example, MOSFETs M1 and M2) that are employed in the operation of the circuit 250. In circuit 250, as depicted, $Ic\_in_2p$ is a programmable current source used to compensate the dark current from SiPM anode 112 and offset from the preceding circuits (e.g., front-end amplifiers 152). Similarly, $Ic\_in_2n$ is a programmable current sink used to compensate the dark current from SiPM anode 112 and offset from the preceding circuits. Lastly, in this example, $Ic\_out_2$ is a programmable current source used to compensate the dark current from SiPM anode 112 and offset from the preceding circuits. As will be appreciated from the schematic, $Ic\_in_2p$ and $Ic\_in_2n$ operate on the input signal (i.e., $Iout_1$) to the weighting amplifier 164 prior to the weighting operation while $Ic\_out_2$ operates on the weighted signal prior to being output as $Iout\_W_1$.

Figure 8:
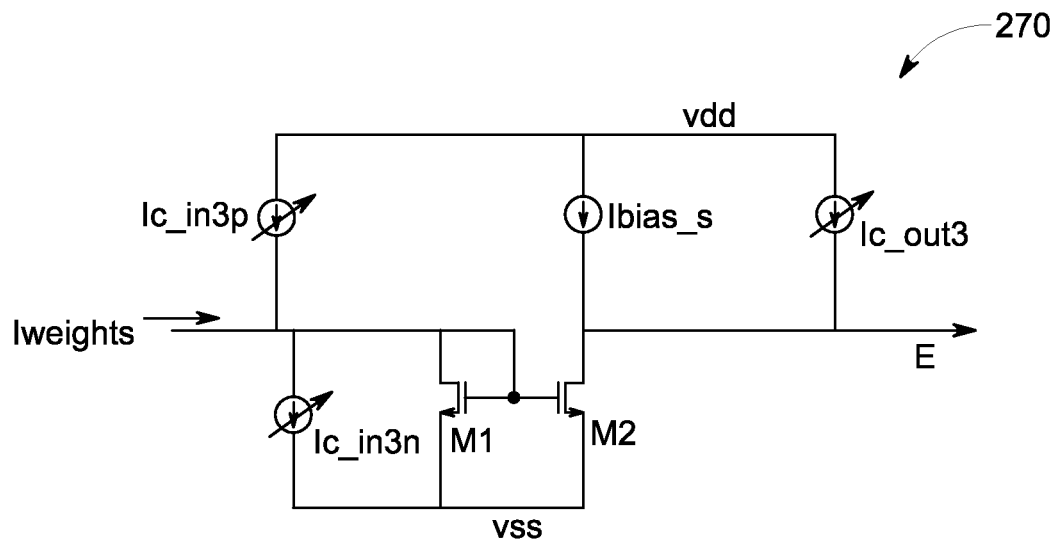
FIG. 8 is a circuit view of a summing amplifier circuit, in accordance with aspects of the present disclosure.

Turning to FIG. 8, an example of a circuit 270 is depicted that, in one implementation, may be used to compensate dark current in a summing amplifier 170. As in the preceding examples, the controller 174 generates control signals that configure (i.e., program) programmable current source(s)/sink(s) within the circuit 270. In the depicted example, the programmable sources and sinks include: $Ic\_in_3p$, $Ic\_in_3n$, and $Ic\_out_3$. The depicted circuit also includes a pair of FET devices (in the depicted example, MOSFETs M1 and M2) that are employed in the operation of the circuit 270. In circuit 270, as depicted, $Ic\_in_3p$ is a programmable current source used to compensate the dark current from SiPM anode 112 and offset from the preceding circuits (e.g., front-end amplifiers 152 and weighting amplifiers 164). Similarly, $Ic\_in_3n$ is a programmable current sink used to compensate the dark current from SiPM anode 112 and offset from the preceding circuits. Lastly, in this example, $Ic\_out_3$ is a programmable current source used to compensate the dark current from SiPM anode 112 and offset from the preceding circuits. As will be appreciated from the schematic, $Ic\_in_3p$ and $Ic\_in_3n$ operate on the input signal (i.e., $Iout\_W$, the summed value of the respective $Iout\_W_x$ outputs) to the summing amplifier 170 (that is, they operate on the summed signal) while $Ic\_out_3$ operates on the signal prior to being output as energy signal 124.

With the foregoing discussion in mind, the respective circuits depicted in FIGS. 6-8, may be employed, in one implementation, to allow adjustment and allocation of the compensation current 200 within the ASIC 120. That is, the controller 174 of the ASIC 120 may be employed to program or otherwise configure the respective programmable sources and sinks of the circuits 230, 250, and 270 throughout the signal path to allow compensation of any dark current present in the initial input signal 180 (i.e., $Iin_x$), as measured in the output energy signal 124. In practice, the compensation circuits 230, 250, 270 consume a negligible amount of power, while maintaining the desired linear dynamic range. Further, as will be appreciated, the disclosed programmable compensation circuits make the readout electronics more flexible in interfacing SiPM devices with different design and operating parameters.

Technical effects of the invention include the use of programmable sources and sinks within a signal path to compensate for the present of dark current in an input signal. In one embodiment, an offset in an output signal is measured and used, such as by a controller, to determine the proper amount of a compensation current and to allocate the proper portions of the compensation current to different nodes along a signal processing chain. The process may be iterated as needed.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:
1. A detector module, comprising:
an application specific integrated circuit (ASIC) that comprises:

one or more channel inputs configured to receive respective analog inputs from one or more photo-sensors;

a front-end circuit configured to receive the analog inputs and to output at least initial energy signals, the front-end circuit comprising a respective front end amplifier for each analog input;

a weighting circuit configured to receive the initial energy signals and configured to output weighted signals, wherein the weighting circuit comprises weighting amplifiers;

an energy summing circuit configured to receive the weighted signals and configured to output at least a summed energy signal, wherein the energy summing circuit comprises a summing amplifier; and a controller configured to measure a dark current present in the summed energy signal; to determine a compensation current sufficient to counter the dark current, and to apply the compensation current through one or more of the front-end, weighting, or summing amplifiers.

2. The detector module of claim 1, wherein the controller is separate from the ASIC.

3. The detector module of claim 1, wherein the controller is provided on the ASIC.

4. The detector module of claim 1, wherein applying the compensation current through the one or more of the amplifiers comprises adjusting one or more programmable sources and/or sinks associated with the one or more amplifiers.

5. The detector module of claim 1, wherein the one or more photo-sensors comprise silicon photomultipliers (SiPMs).

6. The detector module of claim 1, wherein the weighting amplifiers are configured to weight the respective initial energy signals derived from the analog inputs to generate the weighted signals.

7. The detector module of claim 1, wherein the summing amplifier is configured to combine the weighted signals and to output the summed energy signal.

8. The defector module of claim 1, wherein the front end amplifiers, weighting amplifiers, and a summing amplifier are configured to, in cooperation, process the analog inputs to generate the summed energy signal.

9. The detector module of claim 1, wherein the controller allocates a portion of the compensation current to each of the front end amplifiers, the weighting amplifiers, and the summing amplifier.

10. The detector module of claim 1, wherein the respective analog inputs each comprise a dark current component and a signal component.

11. The detector module of claim 1, wherein the summed energy signal is indicative of at least an energy associated with a photon impact detected by the one or more photo-sensors.

12. A detector system, comprising:

a plurality of photo-sensors configured to each generate a respective measured signal, wherein each measured signal comprises a dark current component and a signal component;

an application specific integrated circuit (ASIC) configured to receive the measured signals as inputs, to process the measured signals along a signal processing path to generate at least an output energy signal, and to apply a compensation current at one or more points in the signal processing path to compensate the dark current component in the output energy signal, wherein the signal processing path of the ASIC comprises:

a front-end circuit configured to receive the measured signals and to output at least initial energy signals, the front-end circuit comprising a plurality of front end amplifiers;

a weighting circuit configured to receive the initial energy signals and configured to output weighted signals, wherein the weighting circuit comprises weighting amplifiers;

an energy summing circuit configured to receive the weighted signals and configured to output at least the output energy signal, wherein the energy summing circuit comprises a summing amplifier.

13. The detector system of claim 12, wherein the ASIC is further configured to determine the amplitude of the compensation current by monitoring the output energy signal.

14. The detector system of claim 12, wherein the ASIC is further configured to allocate the compensation current between multiple points in the signal processing path.

15. The detector system of claim 12, wherein the compensation current is applied at the one or more points in the signal processing path by programming one or more programmable sources and/or sinks within the signal processing path.

16. The detector system of claim 15, wherein the one or more programmable sources and/or sinks are provided as components of one or more of the front cod amplifiers, weighting amplifiers, or summing amplifier within the signal processing path.

\* \* \* \* \*